United States Patent [19]
Bapat et al.

[11] Patent Number: 5,847,580
[45] Date of Patent: Dec. 8, 1998

[54] HIGH SPEED BIDIRECTIONAL BUS WITH MULTIPLEXERS

[75] Inventors: Shekhar Bapat; Sridhar Krishnamurthy, both of Santa Clara, Calif.

[73] Assignee: Xilinx, Inc., San Jose, Calif.

[21] Appl. No.: 729,065

[22] Filed: Oct. 10, 1996

[51] Int. Cl.$^6$ .............................................. H03K 19/0175

[52] U.S. Cl. ................................ 326/82; 326/39; 326/86; 326/90

[58] Field of Search ................................. 326/37, 38, 39, 326/40, 41, 82, 86, 90

[56] References Cited

U.S. PATENT DOCUMENTS

| | | | |
|---|---|---|---|
| Re. 34,363 | 8/1993 | Freeman | 326/38 |
| 5,001,368 | 3/1991 | Cliff et al. | 326/40 |
| 5,185,706 | 2/1993 | Agrawal et al. | 364/489 |
| 5,231,588 | 7/1993 | Agrawal et al. | 326/41 |
| 5,317,209 | 5/1994 | Garverick et al. | |
| 5,504,440 | 4/1996 | Sasaki | 326/41 |
| 5,635,851 | 6/1997 | Tavana | 326/86 |
| 5,646,546 | 7/1997 | Bertolet et al. | 326/39 |
| 5,677,638 | 10/1997 | Young et al. | 326/39 |

OTHER PUBLICATIONS

"The Programmable Logic Data Book", 1996, published by Xilinx Inc., 2100 Logic Drive, San Jose, California, 95124, pp. 4–1 to 4–49.

Primary Examiner—Michael Tokar
Assistant Examiner—Daniel D. Chang
Attorney, Agent, or Firm—Jeanette S. Harms

[57] ABSTRACT

A multiplexer chain is coupled to two logic gates which in turn propagate their respective output signals in different directions, thereby providing bidirectional signal distribution. The output lines of multiple multiplexer chains are combined together using a logic gate chain to create a bus line with a larger number of drivers while substantially maintaining switching speed and flexibility in routability. In one embodiment, two OR chains propagate signals in opposite directions. The top OR chain combines the outputs of all the multiplexer chains to its left. Similarly, the bottom OR chain combines the outputs of all the multiplexer chains to its right. The output of the entire bus is provided at both the leftmost and the rightmost end of the OR chain. The bus output is also provided at tap points by combining the outputs of the top logic gate chain and the bottom logic gate chain using a logic gate. The top logic gate chain provides the outputs of all drivers to the left of the tap point while the bottom logic gate chain provides the outputs of all drivers to the right of the tap point.

20 Claims, 14 Drawing Sheets

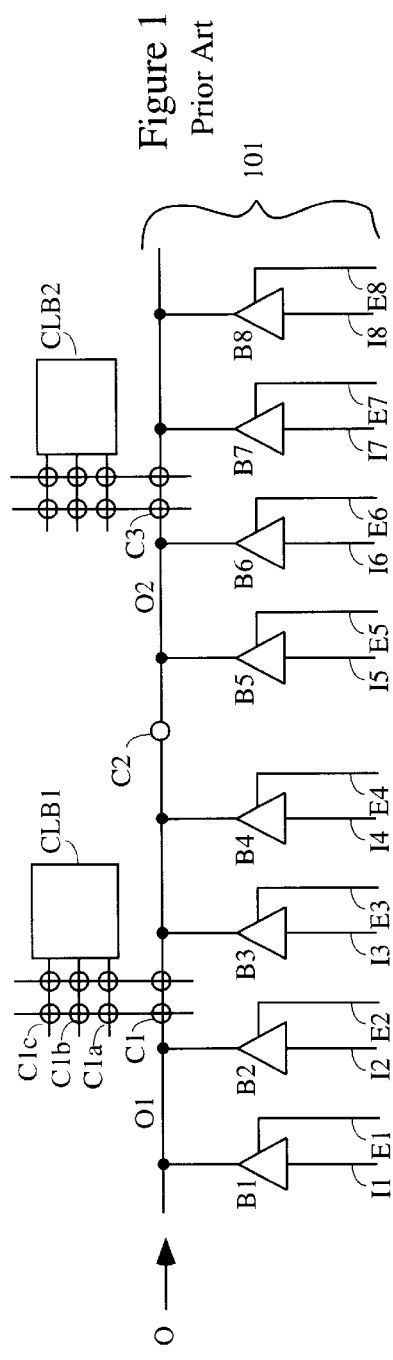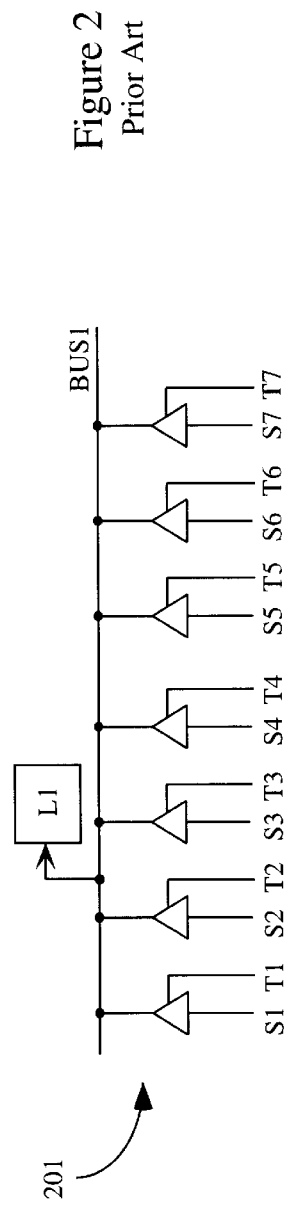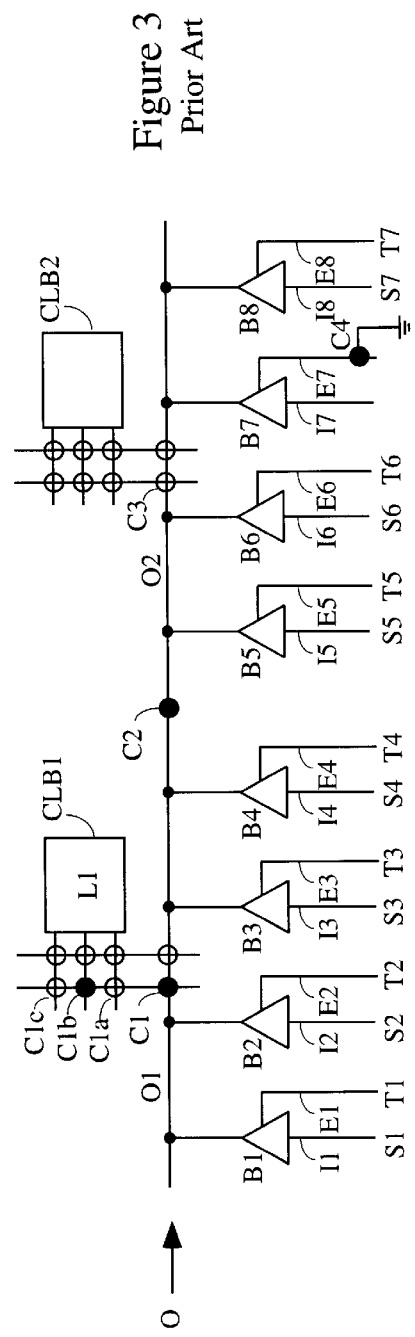

HIGH SPEED BIDIRECTIONAL BUS WITH MULTIPLEXERS

BACKGROUND OF THE INVENTION

1. Field of the Invention

The invention relates to programmable logic devices, and particularly to driving a bidirectional bus in a programmable logic device.

2. Description of the Related Art

Programmable logic devices (PLDs) allow an end user to customize the devices to provide specific, user-defined logic functions. PLDs include, for example, field programmable gate arrays (FPGAs). An FPGA includes configurable logic blocks (CLBs) for constructing the user's logic, input/output blocks (IOBs) for providing the interface between the package pins and the internal signal lines, and a programmable interconnect for providing the routing paths to connect the input and output terminals of the CLBs and IOBs to the appropriate networks. A more detailed description of the architecture and the operation of an FPGA is provided in U.S. Pat. Re. 34,363, which is incorporated by reference herein.

In typical FPGAs, the programmable interconnect includes a hierarchical matrix of routing resources to implement the desired routing. These routing resources may include, for example, single-length lines for providing fast routing between adjacent CLBs, double-length lines for skipping certain CLBs, and longlines for distributing signals over long distances (i.e. the entire length or width of the array). In one illustrative architecture provided in the XC4000 family of devices manufactured by Xilinx, Inc., two tristate buffers associated with each CLB drive output signals onto the nearest horizontal longlines above and below the CLB. This architecture is described in more detail in the 1996 Programmable Logic Data Book, pages 4-1 to 4-49, provided by Xilinx, Inc, and incorporated herein by reference. In this architecture, multiple tristate buffers belonging to different CLBs drive the same longline (hereinafter referred to as a bus line) as long as the CLBs are in the same row or column. When a bus line is used, a control system has to ensure that only one driver drives the bus line at one time, otherwise the device may be irreparably damaged.

FIG. 1 shows a bus structure 101 in which tristate buffers (hereinafter buffers) B1–B4 selectively drive a line segment O1. Buffers B1–B4 receive input signals on input lines I1–I4, respectively, typically from various CLBs in the FPGA. A control system, not shown, places tristate (i.e. enable/disable) signals on enable lines E1–E4. An enabling signal on a specific input line allows the input signal on the associated input line to drive the bus line segment. For example, if an enabling signal is provided on enable line E3, then the signal on input line I3 is driven to bus line segment O1. Programmable connectors such as C1, C1a, C1b, and C1c programmably interconnect bus line segment O1 to CLB1.

In this illustrative embodiment, two bus line segments O1 and O2 are selectively connected using a programmable connector C2 to form a single bus line O. Note that in the figures a small black dot indicates a permanent connection, a white circle indicates a programmable connection that is not connected, and a black circle indicates a programmable connection that is connected. Line segment O2 is programmably interconnected in a similar manner to CLB2. Specifically, buffers B5–B8 receive input signals on input lines I5–I8, respectively. Moreover, tristate control signals on enable lines E5–E8 allow the signals on input lines I5–I8 to be selectively driven onto line O2. Thus, if programmable connector C2 is programmed to connect line segments O1 and O2, then any signal provided to buffers B1–B8 can be provided to CLB1 or CLB2. If programmable connector C2 is not programmed to connect line segments O1 and O2, each segment can receive its own driving signal. Typically, multiple segments are selectively connectable using a plurality of programmable connectors.

In FPGAs, a software program typically partitions the user's design into portions which will be implemented in CLBs (called partitioning or mapping), selects particular CLBs to implement each portion (called placement), and finally selects the programmable interconnect to connect the CLBs together according to the user's design (called routing). Because of the complexity of partitioning, placing, and routing (PPR), the software may elect to skip some buffers when placing the logic of the FPGA. For example, FIG. 2 illustrates part of a user's logic design 201 in which seven signals S1–S7 are selectively placed onto a bus BUS1, which in turn provides an input signal to a logic element L1. Selection of signals S1 through S7 is controlled by tristate control signals T1 through T7, respectively.

FIG. 3 shows one implementation of the user's logic design of FIG. 2 in the FPGA structure of FIG. 1. To selectively connect seven signal lines to the same bus, line segments O1 and O2 are connected together by programming connector C2. Logic element L1 is implemented by CLB1. In this implementation, connectors C1 and C1b are programmed to connect line segment O1 to CLB1. Connector C3 is not programmed, because CLB2 is not needed. As determined by the PPR software, buffer B7 is skipped and signal S7 is therefore placed on input line I8. Buffer B7 is disabled by connecting enable line E7 to ground through a connector C4. During operation, a control circuit (not shown) places an enable signal onto one of enable lines E1–E6 and E8 to turn on the corresponding buffer. For example, if enable line E5 receives the enable signal, then signal S5 is transferred from input line I5 to line segments O2 and O1 and finally provided to CLB1.

Note that buffers B1–B8 are sized to drive any logic elements that are connected to line segments O1 and O2. However, if too many input signals are buffered onto bus O and too many logic elements are driven by bus O, either the size of the buffers B1–B8 is undesirably large or the speed of signal propagation is undesirably slow.

SUMMARY OF THE INVENTION

In accordance with the present invention, the output signal of a multiplexer chain is provided to two logic gates which in turn propagate their respective output signals in different directions, thereby providing bidirectional signal distribution. A discrete multiplexer chain of size N implements a bus with N drivers. In the present invention, each of the two logic gates forms part of a logic gate chain. In this manner, multiple multiplexer chains interconnected via the two logic gate chains implement a flexible, high-speed bus with multiple drivers. In one embodiment, two OR chains propagate signals in opposite directions. The top OR chain combines the output of all the multiplexer chains to its left. Similarly, the bottom OR chain combines the output of all the multiplexer chains to its right. Thus, the output of the entire bus is provided at both the leftmost and the rightmost end of the OR chain. In another embodiment, two AND chains propagate signals in opposite directions.

In accordance with the present invention, the bus output is also made available at intermediate points, referred to as tap points, by combining the outputs of the top logic gate chain and the bottom logic gate chain using a logic gate. The top logic gate chain provides the outputs of all drivers to the left of the tap point while the bottom logic gate chain provides the outputs of all drivers to the right of the tap point. In one embodiment, tap points are provided between each adjacent multiplexer chain, thereby significantly reducing routing inefficiencies. Specifically, in contrast to directional drivers, the present invention minimizes the need for additional programmable interconnect and eliminates undesirable timing delays.

The present invention allows large number of drivers to drive a bus line at high speed. At the same time, the present invention can be partitioned to implement multiple buses, each bus being driven by a selected number of drivers. Further, the present invention does not constrain the drivers to be placed along a row (or a column), thereby providing significant flexibility for the partitioning, placing, and routing software.

BRIEF DESCRIPTION OF THE DRAWINGS

FIG. 1 illustrates a prior art tristate buffer structure for driving a bus.

FIG. 2 shows part of a user's logic design for implementation in an FPGA.

FIG. 3 shows an example implementation of the user's logic design of FIG. 2 in the tristate buffer structure of FIG. 1.

DETAILED DESCRIPTION OF THE DRAWINGS

Figure 4:
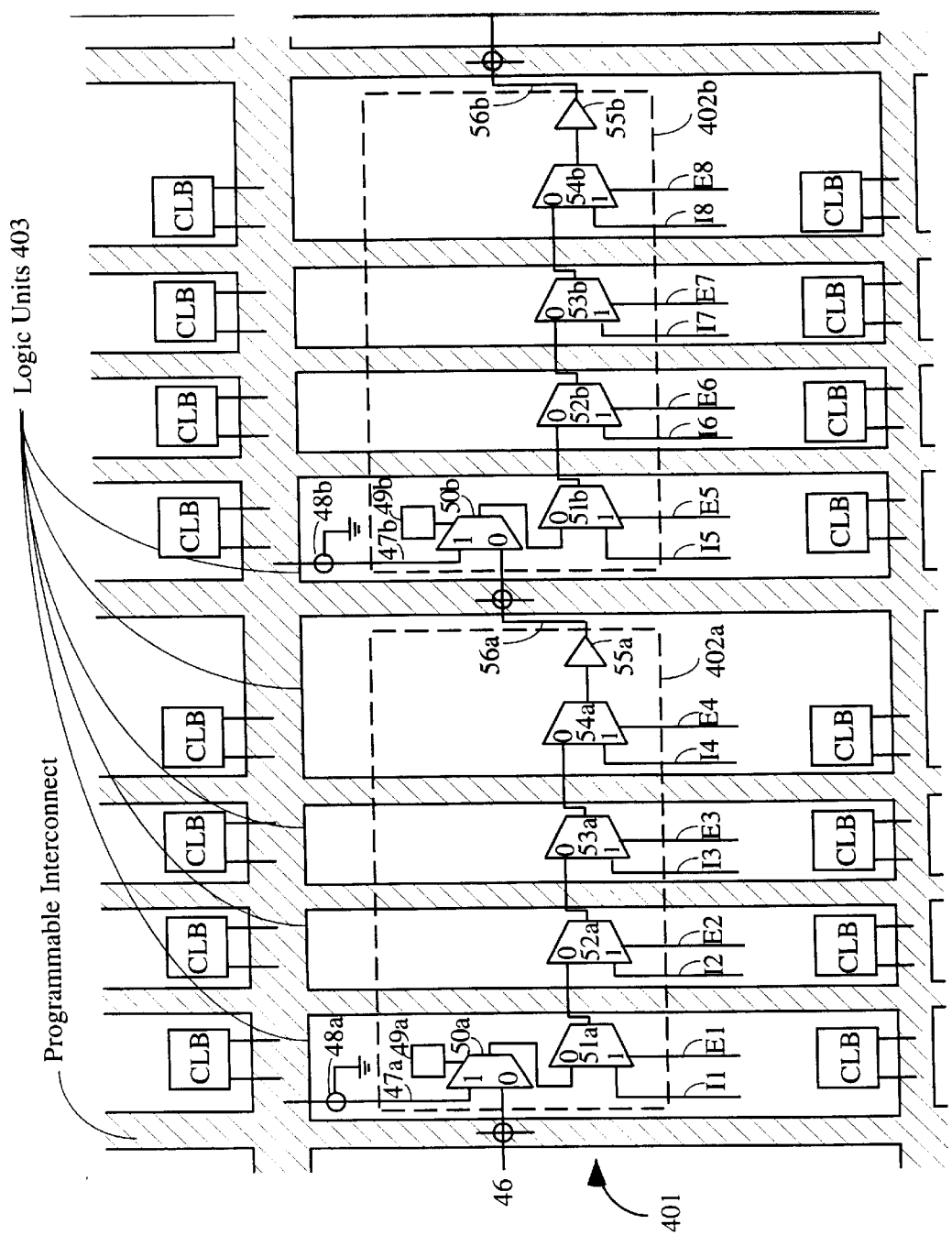
FIG. 4 illustrates a bus structure including a plurality of multiplexer chains.

FIG. 4 illustrates a plurality of logic units 403, each logic unit 403 including a CLB and a portion of a bus structure 401. Bus structure 401, in this embodiment, includes two multiplexer chains 402a and 402b which replaces the prior art, tristate bus structure 101. Shaded regions indicate the programmable interconnect of the FPGA. The first multiplexer chain 402a comprises multiplexers 50a–54a and buffer 55a, wherein the second chain 402b comprises multiplexers 50b–54b and buffer 55b. Multiplexer 50a receives an input signal on line 46 from another multiplexer chain (not shown) and another input signal on line 47a from the programmable interconnect.

In any sequence of multiplexer chains, the first multiplexer chain is "initialized" to logic 0. In other words, multiplexer 50a must output a logic 0. To provide this output signal, two steps are performed. In the first step, connector 48a is programmed to connect ground to line 47a. Multiplexer 50a is controlled by a memory cell 49a, wherein a logic 1 in memory cell 49a causes the signal on line 47a to be forwarded to multiplexer 51a and a logic 0 in memory cell 49a causes the signal on line 46 to be forwarded. Thus, in the second step, a logic 1 is stored in memory cell 49a, thereby providing a logic 0 output signal. If no enable signal on lines E1–E4 is a logic 1, then the output signal from multiplexer 50a (in this case a logic 0) is forwarded to buffer 55a and placed onto bus line 56a. On the other hand, if any enable signal on lines E1–E4 is logic 1, then the signal on the corresponding multiplexer input line I1–I4 is placed onto bus 56a. Note that although typically the signals on lines E1–E4 and I1–I4 are provided from corresponding CLB, in other embodiments these signals are provided by the programmable interconnect.

If, through a design error or other reason, more than one enable signal is a logic one, multiplexer chain 402a forwards only one signal to its output line 56a. Specifically, the last multiplexer in the chain receiving an enable signal of logic 1 will forward the signal on its input (I) terminal to output line 56a. For example, assuming that both multiplexers 52a and 54a both receive enable signals of logic 1, only the signal provided on input line I4 is forwarded to output line 56a. Thus, in contrast to the prior art tristate buffer structure 101 (FIG. 1), multiplexer chain 402a prevents any signal contention.

A subsequent multiplexer chain, i.e. multiplexer chain 402b, is connected to the first chain, i.e. multiplexer chain 402a, by placing logic 0 into memory cell 49b. In this manner, eight input signals selectively drive a single output line 56b. Because of buffers 55, which provide the requisite amplification of the output signals on lines 56, large numbers of multiplexer chains can be connected. Thus, it logically follows, that a very large number of input signals can selectively drive one bus line. Note that input lines 47a, 47b, 56a, and 56b, although illustrated as forming part of a logic unit, in fact also form part of the programmable interconnect. However, notwithstanding the benefits of bus structure 401, in some applications, the resulting delay of a signal through the multiplexer chains 402 is unacceptable.

To minimize signal delay, a lookahead structure 501 includes two parallel chains of multiplexers 61–64 and 71–74 which receive leading logic 1 and 0 signals, respectively, and provide their respective output signals to multiplexers 65. If the output signal of multiplexer 60a is a logic 1, the multiplexer chain with the leading 1 logic signal (1-chain) is selected, that is, the output signal of multiplexer 64 is selected by multiplexer 65a. If the output of multiplexer 60a is 0, the 0-chain is selected, that is, the output signal of multiplexer 74a is selected. Lookahead structure 501 allows the output signals of multiplexers 60 to control multiplexers 65 without encountering the signal path delay of bus structure 401 (FIG. 4).

Figure 5:
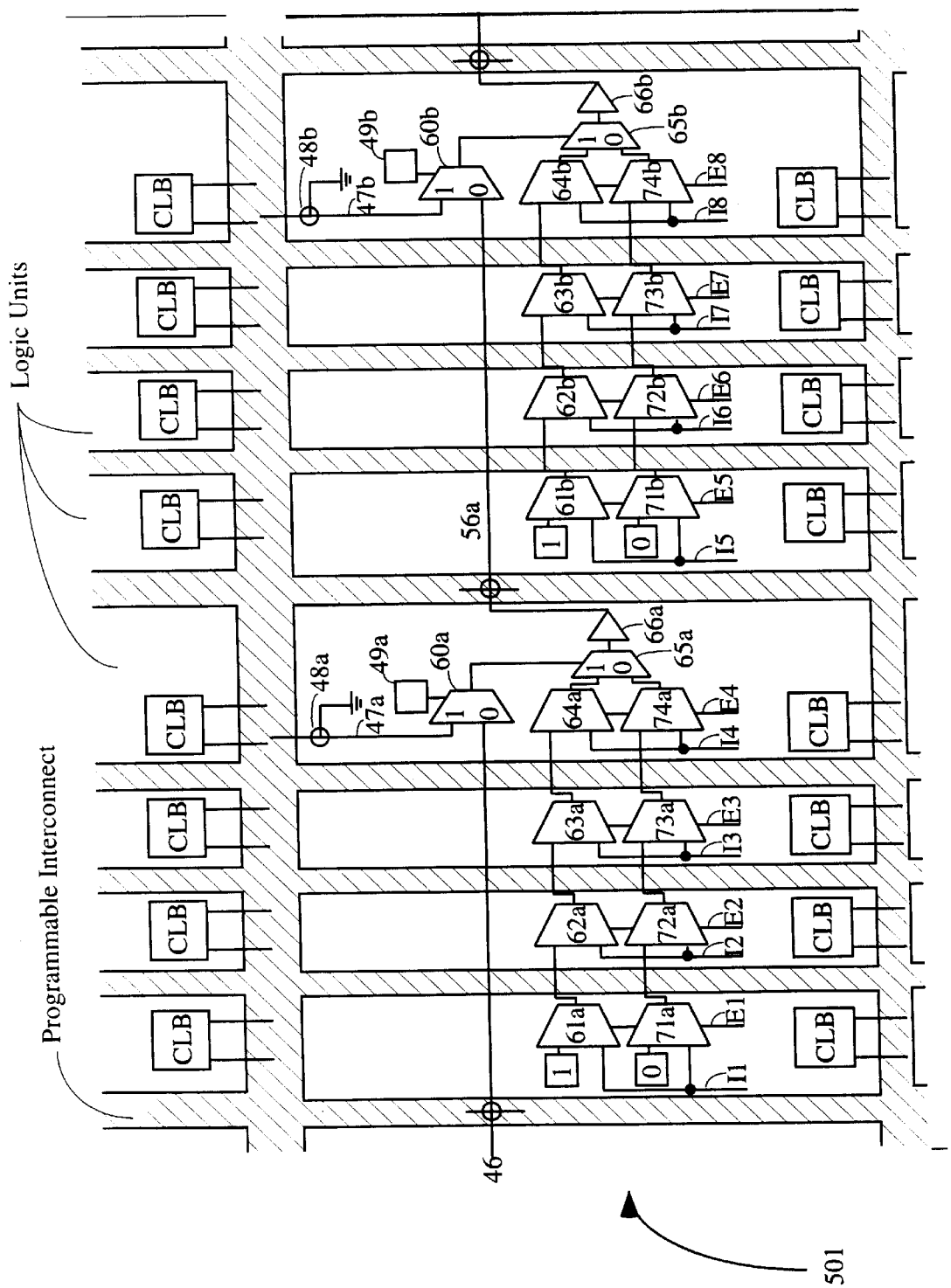
FIG. 5 shows a lookahead structure for shortening the delay of the multiplexer chain.
Figure 6:
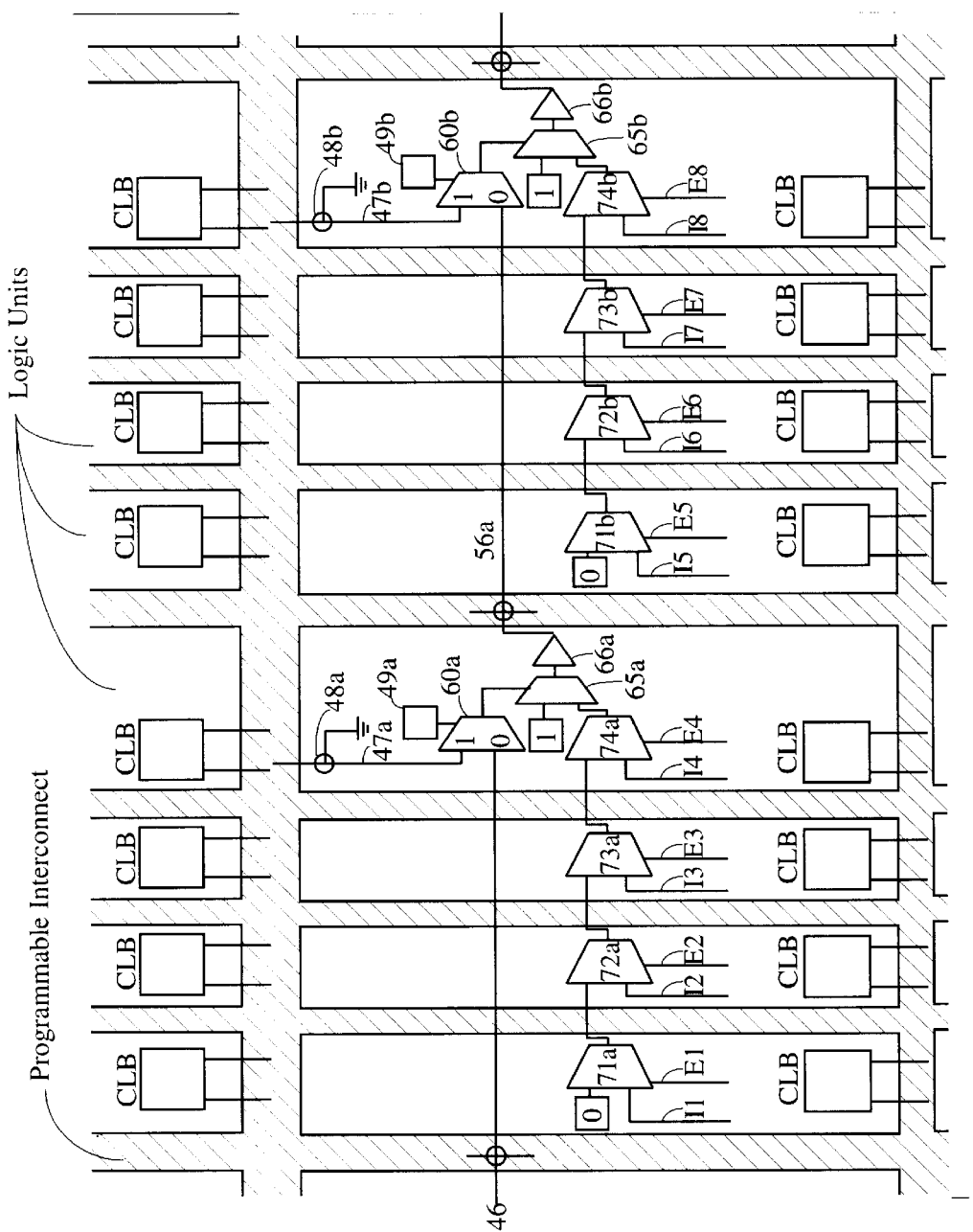
FIG. 6 shows how the circuit of FIG. 5 can be simplified without any loss of function.

FIG. 6 shows how the circuit of FIG. 5 can be simplified without any loss of function. In FIG. 5, if one of the signals on input lines I1–I4 is to be placed onto the bus, a logic 1 is provided on a specific enable line E1–E4. The functionality of a bus line requires that the design cause all other enable signals to be inactive, and thus the logic 0 which initiated the chain is propagated to multiplexer 60a. Thus, the output from multiplexer 60a should be logic 0, thereby causing the 0-chain to be selected by multiplexer 65a. Multiplexer 60a causes multiplexer 65a to select the 1-chain only if a logic 1 is being propagated from the left. This propagated signal indicates that a multiplexer to the left was enabled, its input signal was logic 1, and all enable signals E1 through E4 were inactive. Thus, whenever the 1-chain is selected, the constant logic 1 input signal propagates to multiplexer 65a. Therefore, the 1-chain is not needed. In FIG. 6, the 1-chains including multiplexers 61a–64a and 61b–64b are eliminated and the memory cells initiating the 1-chain provide a direct input signal to multiplexers 65a and 65b.

Figure 7:
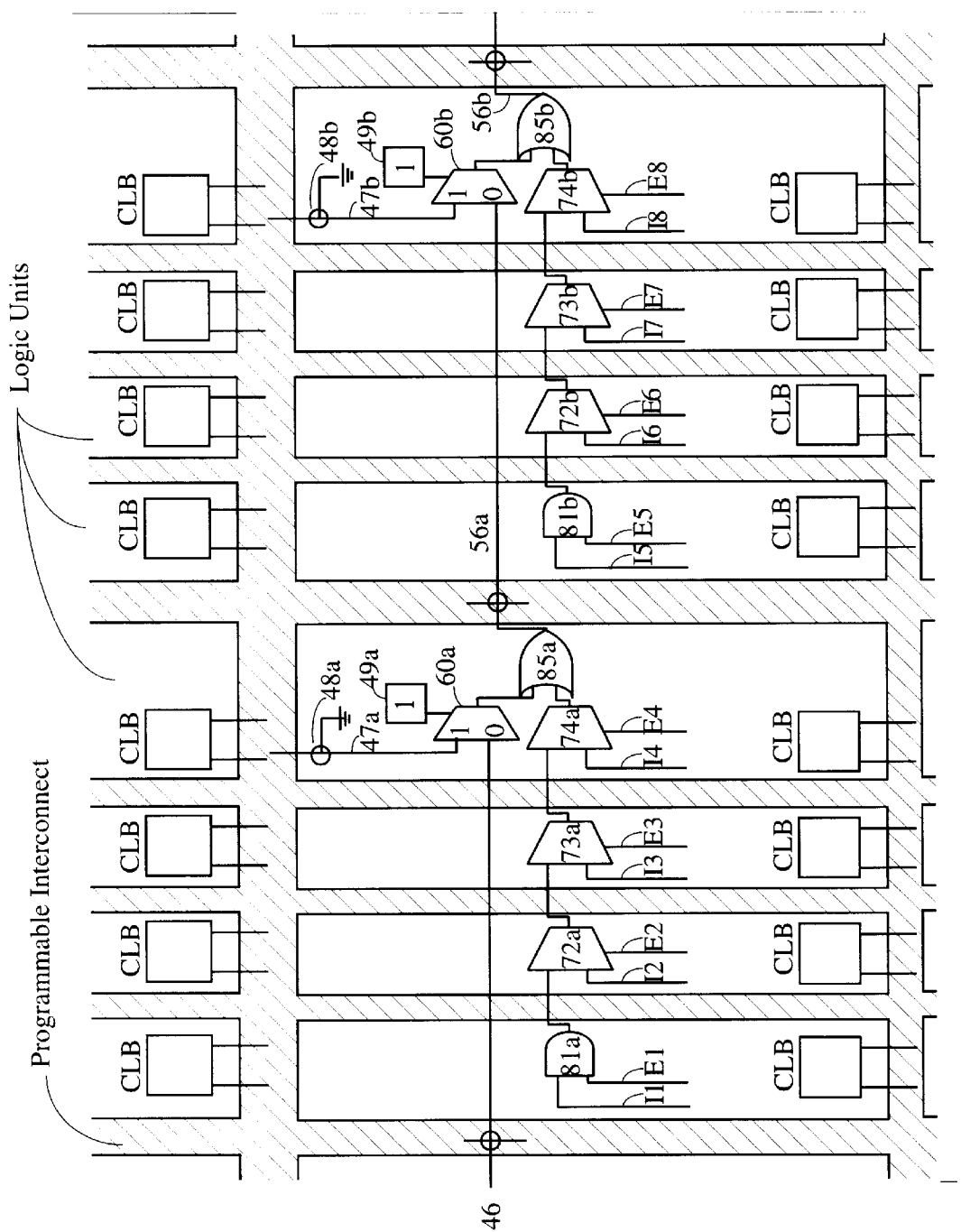
FIG. 7 shows a further simplification from FIG. 6.

FIG. 7 shows a further simplification of FIG. 6. As known by those skilled in the art, a multiplexer with a constant 0 input can be replaced by an AND gate, and a multiplexer with a constant 1 input can be replaced by an OR gate. Thus, multiplexers 71a, 65a and their associated leading 0 and 1 memory cells (FIG. 6) are replaced by AND gate 81a and OR gate 85a. Because an OR gate provides a buffered output signal, buffer 66a of FIG. 6 can also be eliminated. A signal starting to the left on line 46 and propagating to a point to the right on bus line 56b is delayed only by the pass transistor in multiplexer 60a, the drive transistor in OR gate 85a, the pass transistor in multiplexer 60b and the drive transistor in OR gate 85b. Thus, the path is faster than that provided by FIG. 4.

Figure 17:
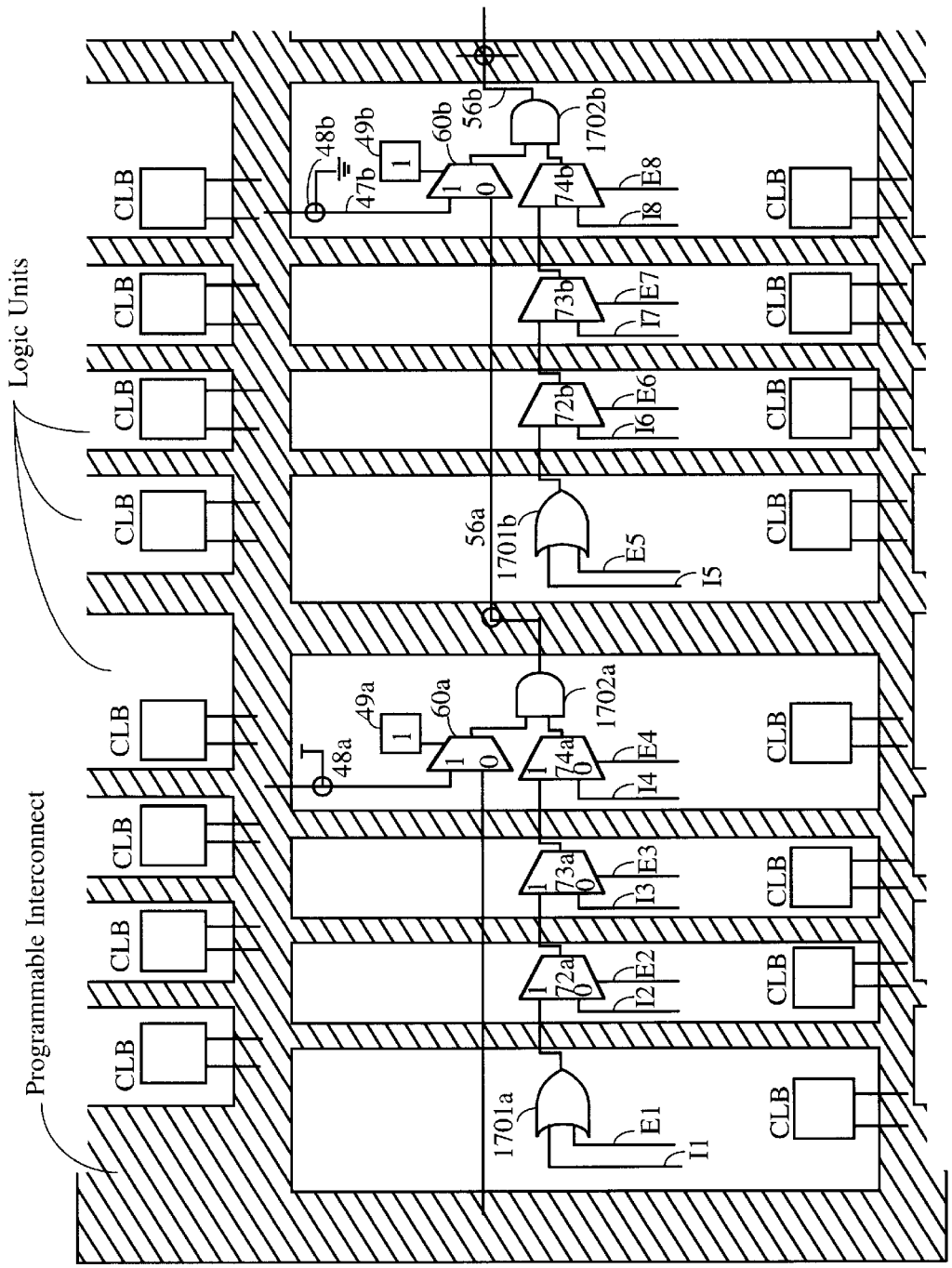
FIG. 17 shows another embodiment of a bidirectional multiplexer chain in accordance with the present invention.

In accordance with one embodiment, the present invention can programmably provide either a pull-down function (described in reference to FIG. 7) or a pull-up function (described in reference to FIG. 17). The embodiment of FIG. 7 provides a pull down function because if no drivers are driving, then the output signal is a logic zero by default. FIG. 17 shows an embodiment providing the pull up function. Note that AND gate 81a, OR gate 85a, and the ground provided to programmable connector 48a (FIG. 7) are replaced by OR gate 1701a, AND gate 1702a, and a voltage supply Vcc. The pins of multiplexers 72a, 73a, and 74a have also been switched to reflect an active low signal. The embodiment of FIG. 17 provides a pull up function because if no drivers are driving, then the output signal is a logic one by default.

Figure 8:
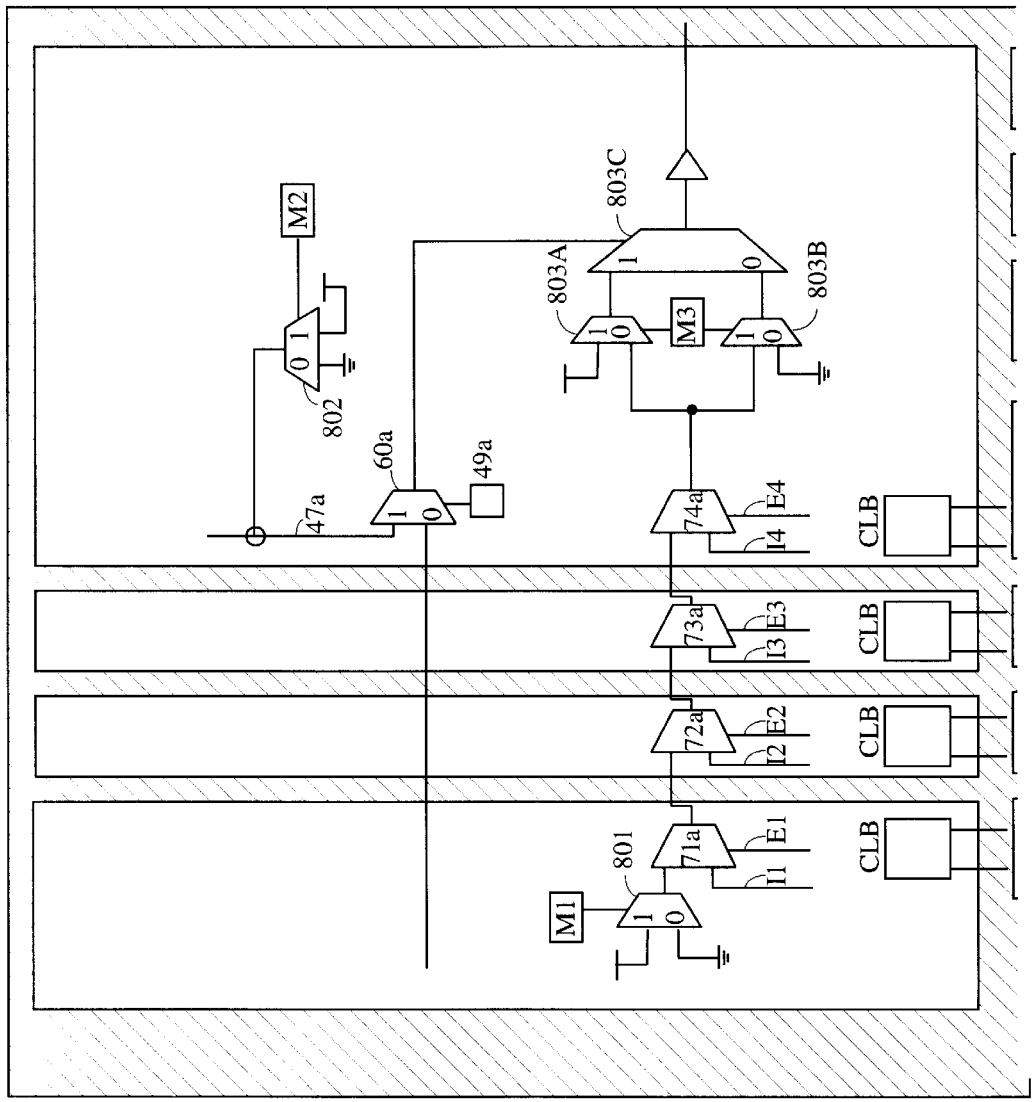
FIG. 8 illustrates a plurality of programmable structures for ensuring optimal flexibility of the multiplexer chain.

To implement either a pull-down function or a pull-up function, multiplexers 65a, 71a, and 60a (FIG. 6) are programmably provided predetermined logic signals. To implement this feature, the zero memory cell associated with multiplexer 71a, the connection to ground associated with connector 48a (FIG. 6), and multiplexer 65a and its associated logic 1 memory cell are replaced with multiplexers 801, 802, and 803A–803C, respectively. (FIG. 8). Multiplexers 801, 802, and 803A–803B are controlled by memory cells M1, M2, and M3, respectively. Table 1 below indicates that depending on the states of memory cells M1, M2, and M3, either a pull down function or a pull up function is provided.

TABLE 1

| Function | M1 | M2 | M3 |
| --- | --- | --- | --- |
| pull down | 0 | 0 | 1 |
| pull up | 1 | 1 | 0 |

Specifically, if memory cell M3 stores a logic one, then multiplexer 803C has a constant 1 input signal, thereby implementing an OR gate (described in detail in reference to FIG. 7). On the other hand, if memory cell M3 stores a logic zero, then multiplexer 803C has a constant 0 input signal, thereby implementing an AND gate. As noted in Table 1, memory cells M1 and M2 always store the same logic state and, thus, in one embodiment comprise the same memory cell. As further noted in Table 1, memory cell M3 always stores the opposite logic state of memory cells M1 and M2. Therefore, in yet another embodiment, only one memory cell is provided, wherein a non-inverted signal is provided to multiplexers 801 and 802 and an inverted signal is provided to multiplexers 803A and 803B.

The present invention also programmably provides a wide OR or a wide AND function. For example, assuming that memory cells M1 and M2 are storing a logic zero and memory cell M3 is storing a logic one, if all input signals on input lines I1–I4 are tied to voltage Vcc (logic one), then multiplexers 71a–74a provide a wide OR function having input signals on lines E1–E4. On the other hand, assuming that memory cells M1 and M2 are storing a logic one and memory cell M3 is storing a logic zero, if all input signals on input lines I1–I4 are tied to ground (logic zero), then multiplexers 71a–74a provide a wide AND function.

As noted previously, the signals on input lines I1–I4 may be provided by CLBs in the device, wherein the CLBs themselves may be implementing logic functions (i.e. OR gates or AND gates). Therefore, in one embodiment in which the input signals are provided by the CLBs, the present invention provides even wider OR gates or wider AND gates.

Figure 9:
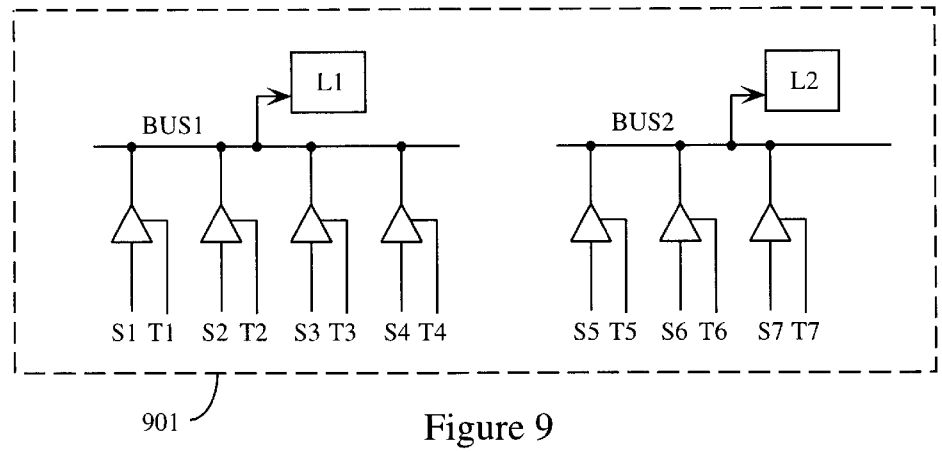
FIG. 9 represents part of a user's design.

FIG. 9 represents part of a user's design, namely two logic devices, L1 and L2, each of which can alternately receive one of several input signals. Logic device L1 is to receive one of input signals S1 through S4 and logic device L2 is to receive one of input signals S5 through S7. The user has indicated that the signal for logic device L1 will be placed onto bus BUS1 and the signal for logic device L2 will be placed onto bus BUS2. Selection of signals S1 through S7 is to be controlled by tristate control signals T1 through T7, respectively.

Figure 10:
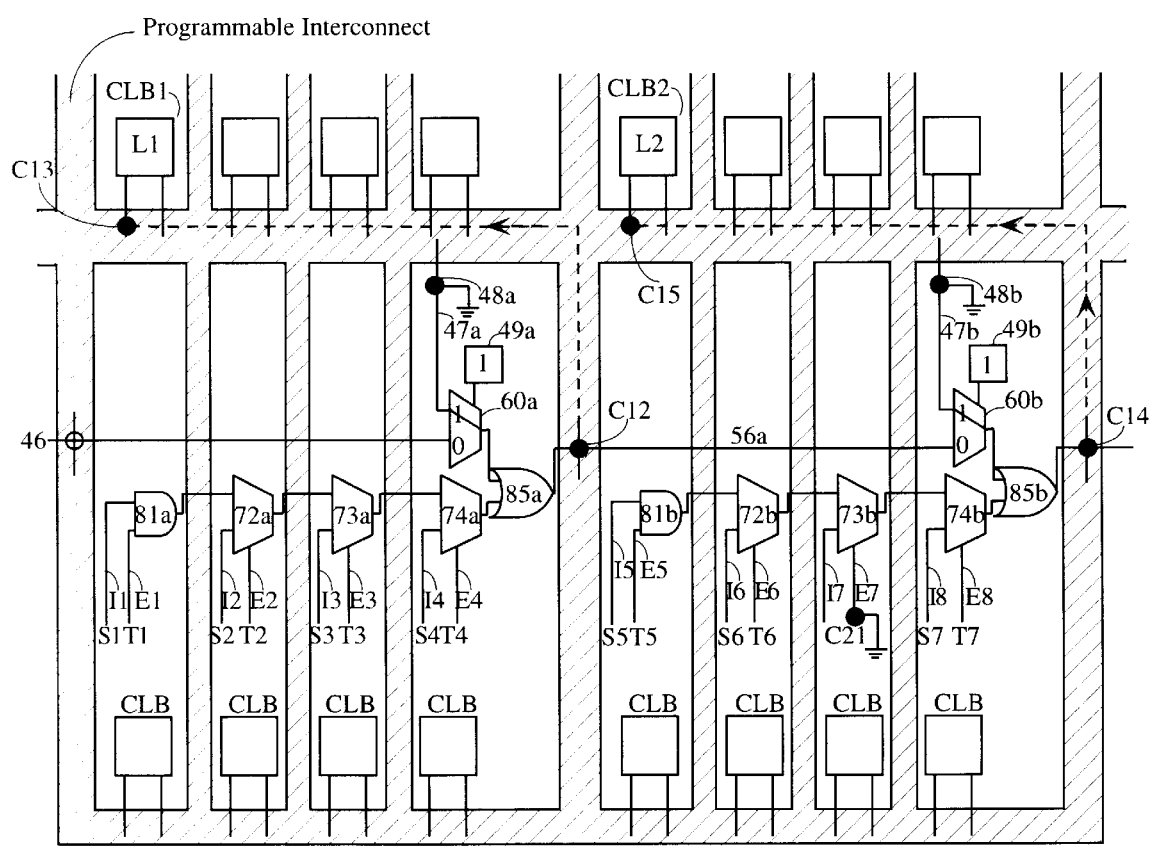
FIG. 10 shows how the structure of FIG. 7 implements the design of FIG. 9.

FIG. 10 shows how the structure of FIG. 7 implements the design of FIG. 9. Memory cell 49a is loaded with a logic 1 and a ground signal is applied to line 47a through connector C48a. This configuration causes multiplexer 60a to forward the ground signal to OR gate 85a, thereby causing OR gate 85a to respond to the multiplexer chain comprising AND gate 81a and multiplexers 72a through 74a. Bus line 56a is connected to the programmable interconnect at connector C12. Interconnections not shown form the path illustrated in dashed lines from connector C12 to connector C13. Connector C13 connects the programmable interconnect to CLB1 (which is configured to implement logic L1). Signals S1 through S4 are applied to lines I1 through I4 and tristate control signals T1 through T4 are applied to enable lines E1 through E4, thereby implementing the left portion of FIG. 9.

To implement the right portion of FIG. 9, a logic 1 is loaded into memory cell 49b so that bus line 56a will not be connected to OR gate 85b. A ground signal is applied through connector C48b and multiplexer 60b to OR gate 85b so that OR gate 85b will respond to the multiplexer chain comprising AND gate 81b and multiplexers 72b, 73b, and 74b. A ground signal is applied to enable line E7 of multiplexer 73b through connector C21 so that input line I7 will be ignored and the signal from multiplexer 72b will be passed to multiplexer 74b. (Note that in this case the software has determined that the logic illustrated in FIG. 9 fits better with the total logic placement if multiplexer 73b is skipped.) Connectors C14 and C15 are programmed, thereby providing the output signal of OR gate 85b to configurable logic block CLB2 (which is programmed to implement logic L2). Signals S5 and S6 are applied to input lines I5 and I6. Signal S7 is applied to input line I8. Tristate control signals T5 and T6 are applied to enable lines E5 and E6. Tristate control signal T7 is applied to enable line E8. Thus, the configuration of FIG. 10 implements the logic design portions shown in FIG. 9.

Figure 11:
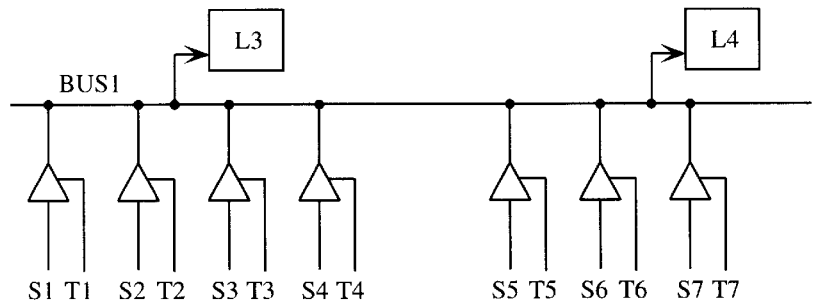
FIG. 11 illustrates part of another design.
Figure 12:
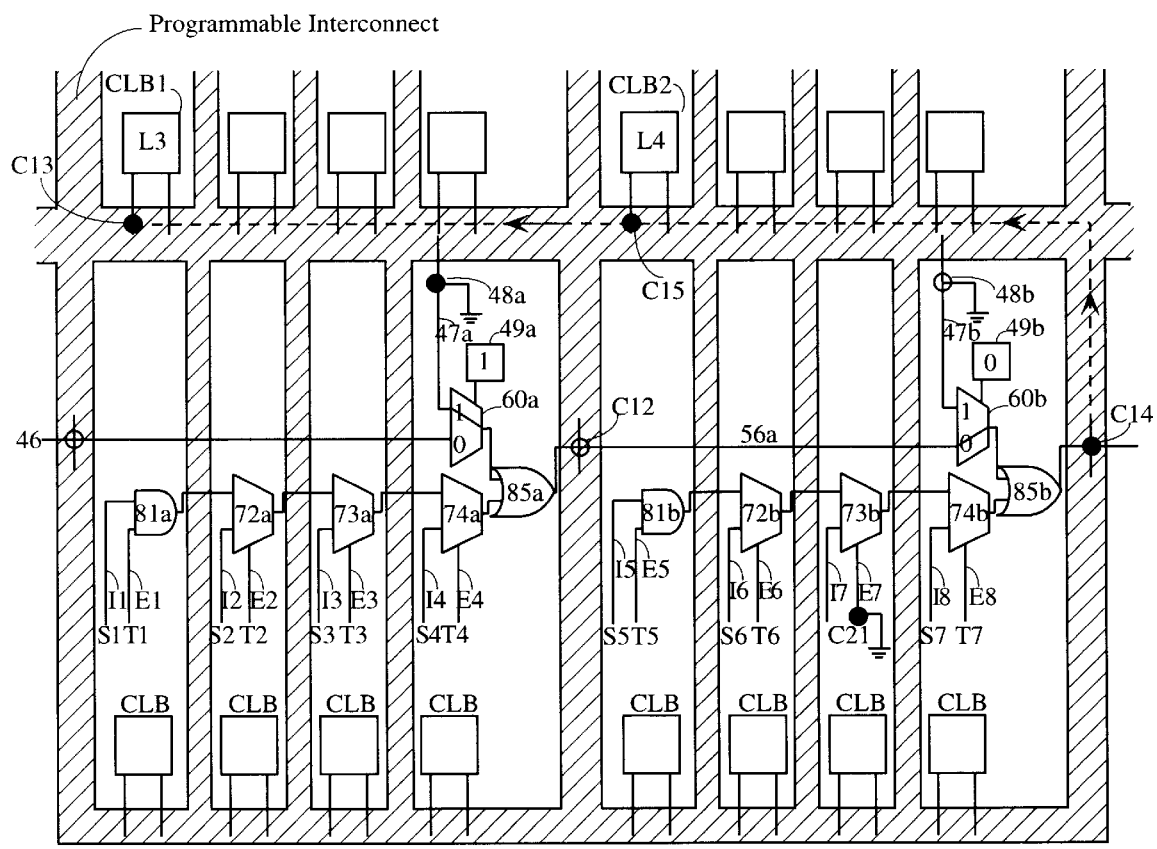
FIGS. 12 and 13 illustrate two ways of implementing the design of FIG. 11.
Figure 13:
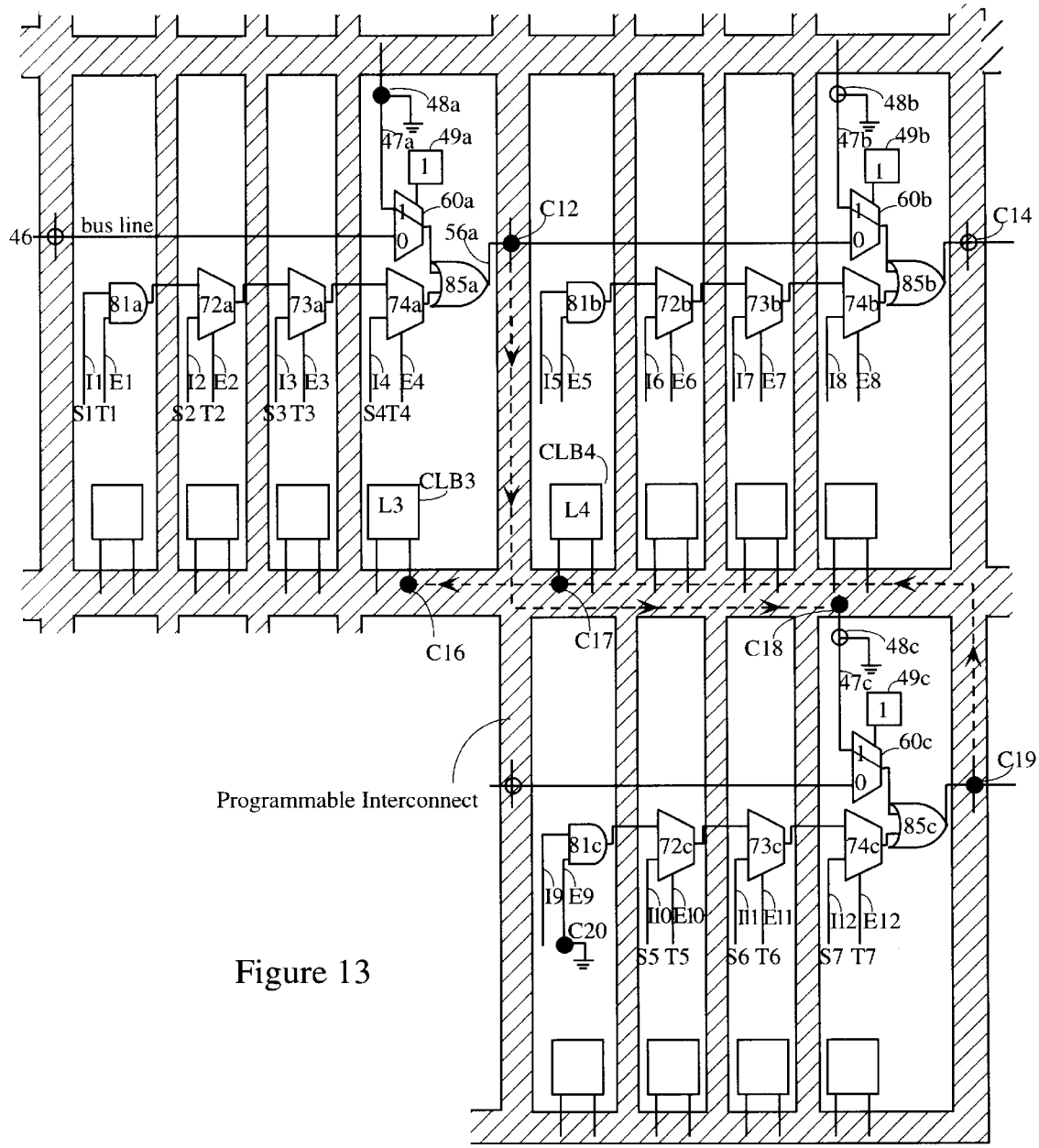

FIG. 11 illustrates part of another user's design in which one of seven input signals S1–S7 is selectively provided to logic elements L3 and L4. FIGS. 12 and 13 illustrate two ways this design can be implemented. In FIG. 12, connector C12 is not used to connect line 56a to the interconnect structure. The left portion of the structure is configured as in FIG. 10. On the right, memory cell 49b is loaded with a logic 0 so that the output signal from OR gate 85a is applied to OR gate 85b. As in FIG. 10, multiplexer 73b is bypassed. The output signal of OR gate 85b is applied to the interconnect structure by programming connector C14. A path is formed through the programmable interconnect and through connectors C13 and C15 to configurable logic blocks CLB1 and CLB2 (which implement logic portions L3 and L4).

Note that OR gate 85b provides a logic 1 output signal if the input signal S1–S7 is a logic one (assuming the corresponding enable signal is a logic one). OR gate 85b provides a logic 0 output signal if the input signal S1–S7 is a logic 0 (once again assuming the corresponding enable signal is a logic one). If no enable signal is a logic one, OR gate provides a logic 0 output signal.

FIG. 13 illustrates an alternative implementation of the same logic, and illustrates that the drivers for driving a signal onto a bus need not be placed along the same line. Signals S1–S4 are driven onto lines I1–I4, as before. However, signals S5 through S7 have been driven onto lines I10 through I12 in another row. As before, connector C12 connects line 56a to the programmable interconnect. A path is found through the programmable interconnect from connector C12 to connector C18, to provide the output signal from OR gate 85a to line 47c, which is associated with another row and column. Memory cell 49c is loaded with a logic 1 to forward the transferred signal to OR gate 85c. Enable line E9 is connected to ground through connector C21, so the signal on input line I9 is ignored. Signals S5 through S7 are placed onto lines I10 through I12 and tristate control signals T5 through T7 are placed onto enable lines E10 through E12. Connector C19 places the output signal of OR gate 85c onto the programmable interconnect. Connectors C16 and C17 forward the signal from the programmable interconnect structure to CLB3 (which implements logic L3) and CLB4 (which implements logic L4). As the signal travels through the programmable interconnect it is buffered as needed. In this configuration, large designs can be efficiently placed into the FPGA. However, this configuration introduces the problem of signal distribution which is described in detail below.

Often, routing complications may occur because of the inherently directional multiplexer chains of FIGS. 4–8. For example, a signal that has traversed through all the logic units in a row of multiplexer chains can only be obtained at the logic unit at farthermost right end of that multiplexer chain. Thus, should that signal be needed at the opposite end of the chain, additional routing resources in the programmable interconnect would be required. Therefore, these multiplexer chains may generate significant routing inefficiencies and create undesirable timing delays as well as squander valuable programmable interconnect. Furthermore, the multiplexer chains of FIGS. 4–8 constrain the placer to place all logic driven by the bus signal near the farthermost right end of the multiplexer chain. Thus, a need arises for a bus structure which eliminates all of the above inefficiencies.

Figure 14:
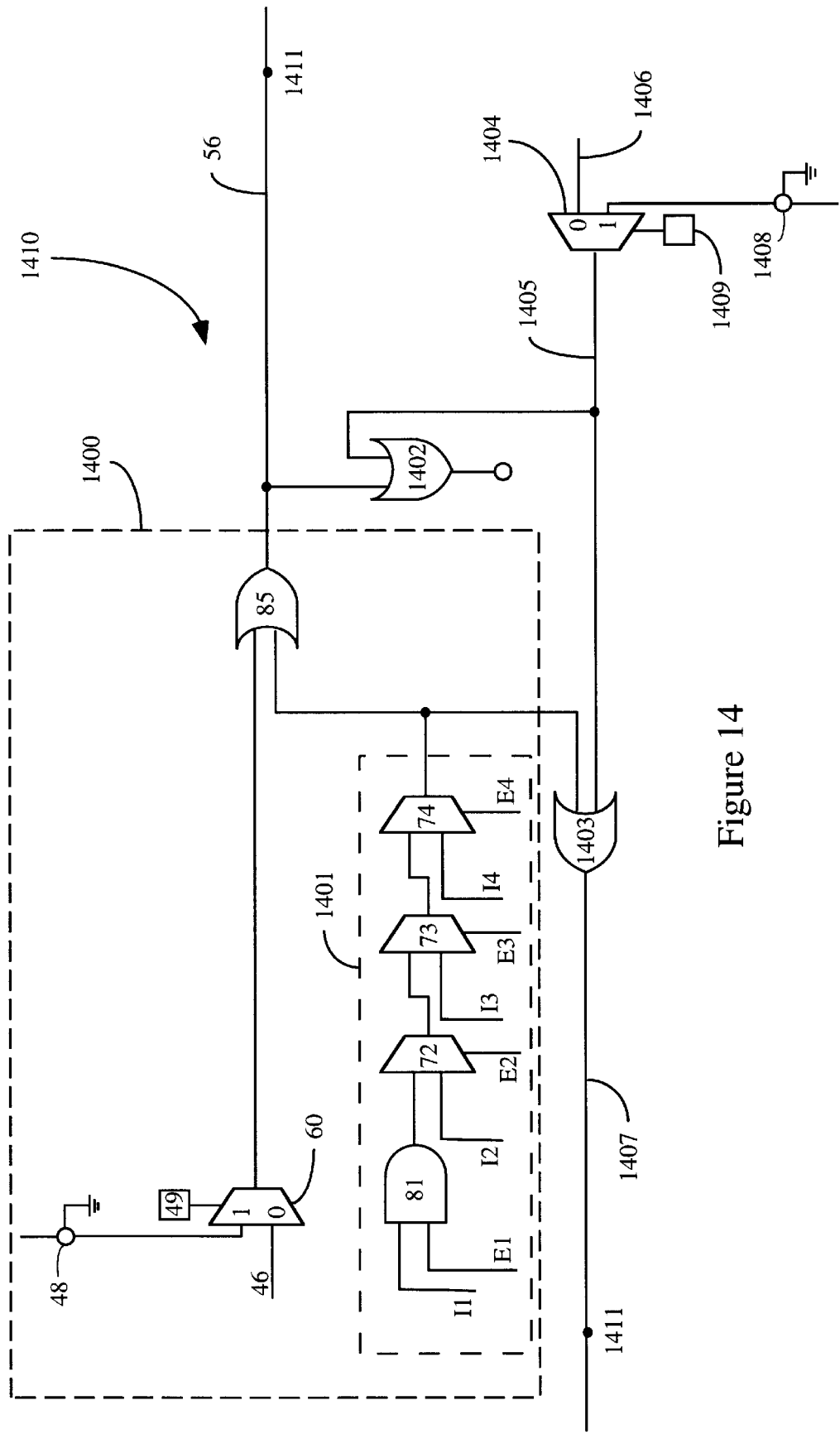
FIG. 14 shows a bidirectional multiplexer chain in accordance with the present invention.

FIG. 14 illustrates a bidirectional multiplexer chain 1410 which provides these advantages. In accordance with the present invention, bidirectional multiplexer chain 1410 duplicates the look ahead feature of FIG. 7 in another direction, thereby providing signal propagation in two directions. Bidirectional multiplexer chain 1410 includes the logic elements of a directional multiplexer chain previously described in reference to FIG. 7 (dashed box 1400). These elements include AND gate 81, multiplexers 60, 72, 73, 74, and OR gate 85. As shown in FIG. 14, the output signal of element set 1401 is provided to OR gate 85 as well as to OR gate 1403. However, the output signals of OR gates 85 and 1403 are propagated in opposite directions. Thus, the output signal of OR gate 85 is provided on line 56 which continues to the right, whereas the output signal of OR gate 1403 is provided on line 1407 which continues to the left. In this manner, bidirectional multiplexer chain 1410 ensures bidirectionality of the bus.

Furthermore, in this embodiment, the present invention advantageously provides a signal tap point for each bidirectional multiplexer chain. Specifically, OR gate 1402 provides the sum of the signals on lines 56 and 1405. In accordance with the present invention, a multiplexer 1404 provides its output signal to OR gate 1403 and to OR gate 1402. Thus, OR gate 1402 sums the output signal of the multiplexer chain to the left (in this case, multiplexer chain 1400) and the output signal of the multiplexer chain to the right (not shown).

Figure 15:
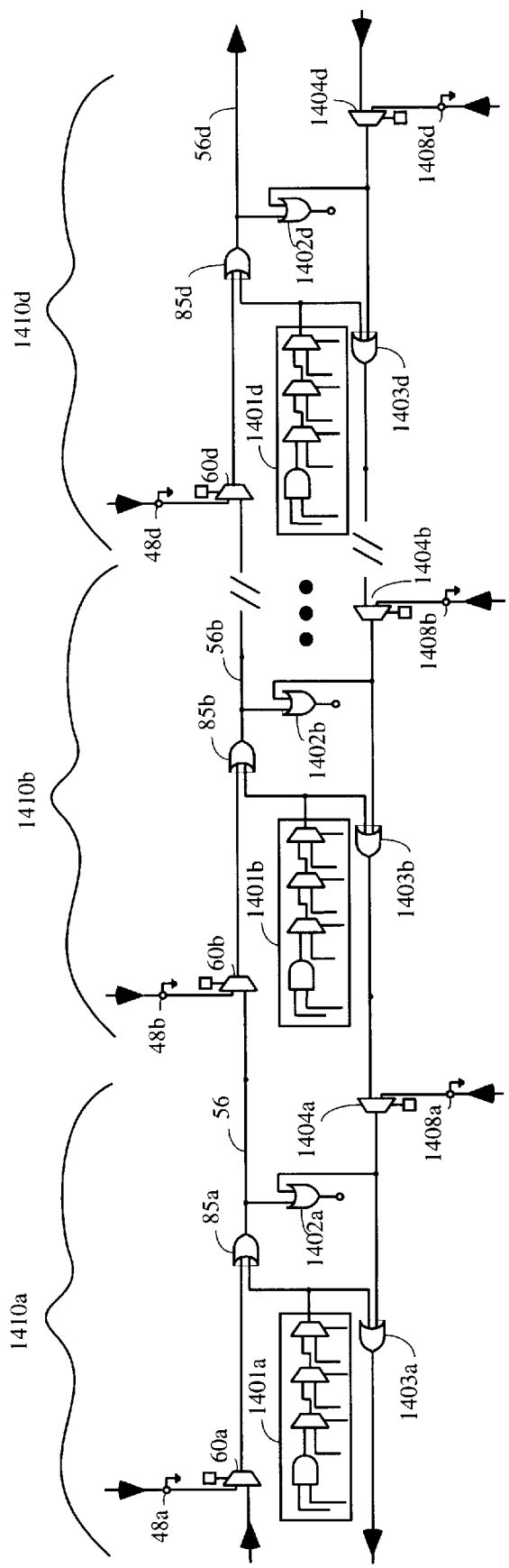
FIG. 15 illustrates a plurality of interconnected bidirectional multiplexer chains on the same row.

Therefore, if multiple, bidirectional multiplexer chains 1410a–1410d are connected as shown in FIG. 15, the output signal of OR gate 1402a, for example, is identical to the signal which propagates through all bidirectional multiplexer chains and exits from the farthermost right multiplexer chain, i.e. from OR gate 85d. Thus, should the output signal of OR gate 85d be needed anywhere along the length of the chain, the present embodiment provides that signal at various tap points along the length of the chain, thereby minimizing routing inefficiencies. In this manner, the present invention minimizes the need for additional programmable interconnect and eliminates the undesirable timing delays associated with directional multiplexer chains. Moreover, OR gates 85a–85d, 1402a–1402d, and 1403a–1403d include buffers (as described in detail in reference to OR gate 85a in FIG. 7) and, therefore, repower the signal as it traverses the chain. In this manner, the present invention ensures that, irrespective of the additional loading, timing delay is minimized.

Figure 16:
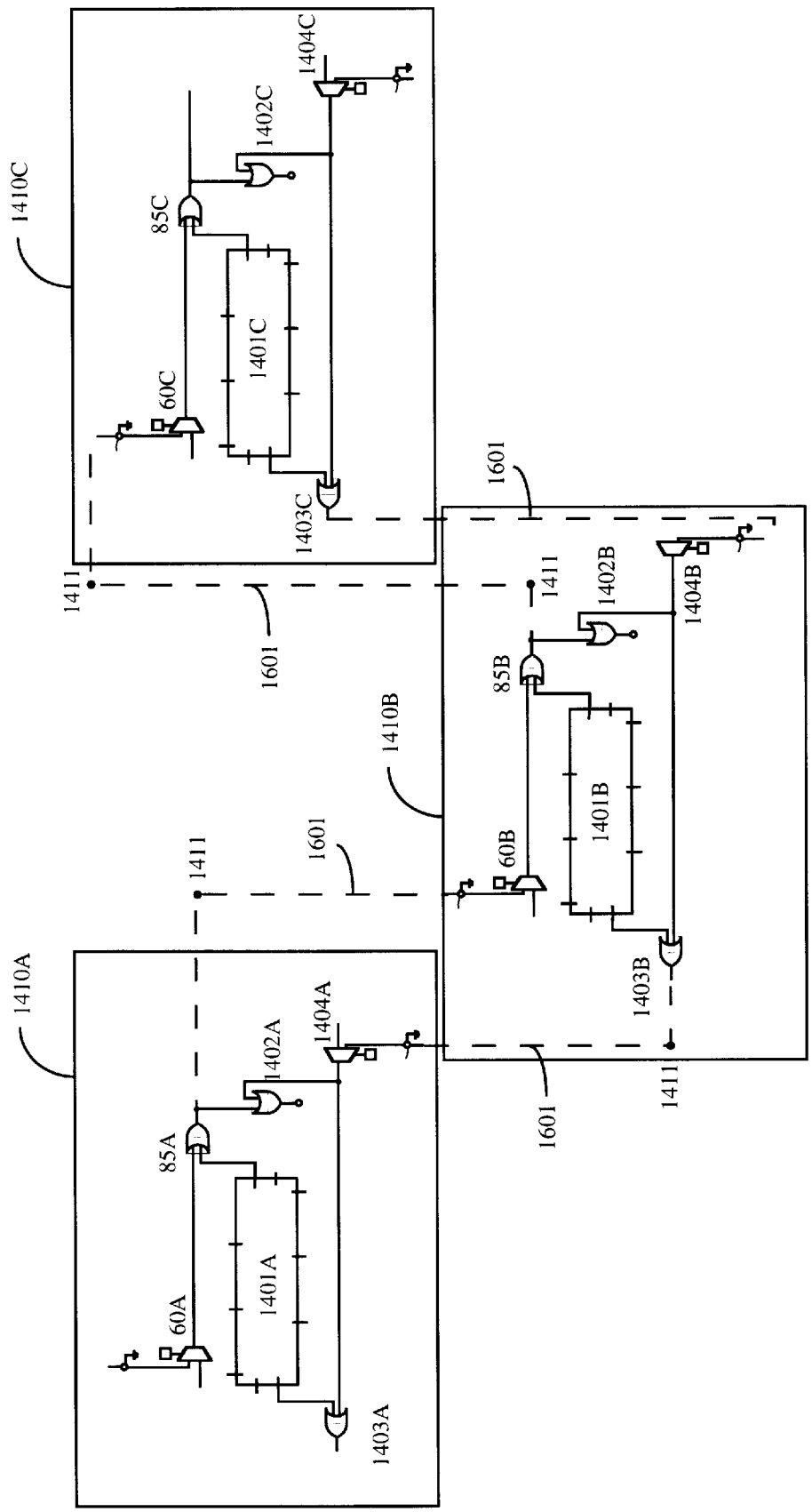
FIG. 16 illustrates a plurality of interconnected bidirectional multiplexer chains on different rows.

By using the programmable connectors and the programmable interconnect, the present invention provides additional routing flexibility such that bidirectional multiplexer chains 1410 need not be adjacent. Specifically, referring to FIG. 16, bidirectional multiplexer chain 1410A is coupled to bidirectional multiplexer chain 1410B which in turn is coupled to bidirectional multiplexer chain 1410C. In this case, bidirectional multiplexer chains 1410A and 1410C are located on a different row than bidirectional multiplexer chain 1410B. In accordance with this configuration, OR gate 1403B is coupled to an input terminal of multiplexer 1404A, OR gate 85A is coupled to an input terminal of multiplexer 60B, OR gate 85B is coupled to an input terminal of multiplexer 60C, and OR gate 1403C is coupled to an input terminal of multiplexer 1404B. In accordance with the present invention, bidirectional multiplexer chain 1410 can be located on any column or row and yet be interconnected to form a bus structure, thereby providing significant flexibility in placing a user's design on an FPGA. To ensure total flexibility, each bidirectional multiplexer chain 1410 includes a tap point 1402 and is interconnectable to other chains via programmable interconnect 1601 and programmable connectors 1411.

Figure 18:
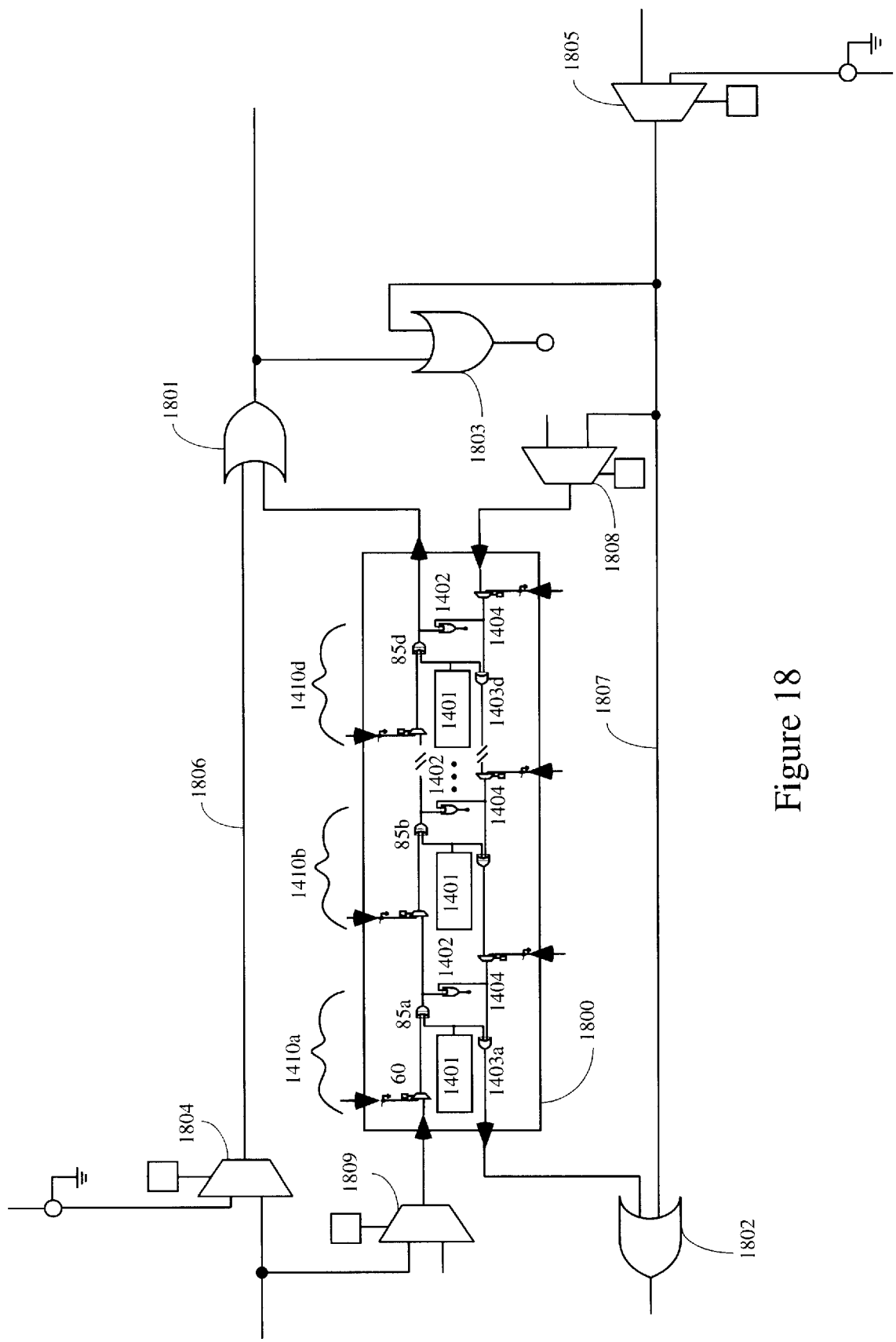
FIG. 18 shows a hierarchical interconnect associated with a bidirectional multiplexer chain.

In accordance with one embodiment of the present invention, groups of bidirectional multiplexer chains are connected via a hierarchical lookahead structure. FIG. 18 illustrates a bidirectional multiplexer group 1800 including bidirectional multiplexer chains 1410a–1410d. OR gate 1801 receives input signals from OR gate 85d (bidirectional multiplexer chain 1410d) and multiplexer 1804, whereas OR gate 1802 receives input signals from OR gate 1403a (bidirectional multiplexer chain 1410a) and multiplexer 1805. OR gate 1803 in turn receives input signals from OR gate 1801 and multiplexer 1805.

This hierarchical lookahead structure further minimizes routing inefficiencies. Specifically, lines 1806 and 1807 of the hierarchial interconnect structure bypass bidirectional multiplexer group 1800, thereby substantially eliminating the time delays associated with bidirectional multiplexer chains 1410a–1410d. In this manner, the present invention decreases the timing delays associated with the output of several multiplexer chains cascaded together. Multiple bidirectional multiplexer groups may be interconnected using the above-described hierarchical interconnect structures. Note that OR gate 1803 provides a tap point at an interval determined by the size of bidirectional multiplexer group 1800 (in this case, four bidirectional multiplexer chains). Because the optimized granularity of the hierarchy (i.e. the number of bidirectional multiplexer chains 1410 in a bidirectional multiplexer group 1800) varies between logic designs, the present invention provides a method for ensuring a signal tap off point substantially in the area required by a particular logic design. Specifically, multiplexers 1808 and 1809 selectively provide access to bidirectional multiplexer group 1800, and thus to bidirectional multiplexer chains 1410a–1410d.

The above embodiments are illustrative only and not limiting. For example, although the above-described embodiments describe a specific number of bidirectional multiplexer chains within a bidirectional multiplexer group, or a specific number of multiplexers within a bidirectional multiplexer chain, other embodiments include different numbers. Those skilled in the art will recognize other embodiments within the scope of the present invention as set forth in the following claims.

We claim:

1. A bidirectional bus including a plurality of segments, each segment comprising:
    a chain of bus drivers, each driver enabled by an enable signal, said chain providing a first output signal;
    a first logic gate receiving said first output signal;
    a second logic gate receiving said first output signal, wherein said first and second logic gates propagate their respective output signals in different directions;
    a first multiplexer providing an output signal to said first logic gate, wherein said first multiplexer selectively provides an input signal from the first logic gate of an adjoining segment; and
    a second multiplexer providing an output signal to said second logic gate, wherein said second multiplexer selectively provides an input signal from the second logic gate of another adjoining segment.

2. The bidirectional bus of claim 1 wherein said chain includes a plurality of multiplexers serially connected, wherein each multiplexer is enabled by an enable signal.

3. The bidirectional bus of claim 1 wherein said first and second multiplexers selectively receive signals from a programmable interconnect structure.

4. The bidirectional bus of claim 1 further including a third logic gate for receiving signals from said first logic gate and said second multiplexer.

5. The bidirectional bus of claim 1 wherein said first and second chains are adjacent.

6. The bidirectional bus of claim 1 wherein said first and second chains are other than adjacent.

7. A hierarchical bidirectional bus comprising:
    a plurality of bidirectional bus segments, each segment including:
        a first chain of drivers providing a chain output signal;
        a first logic gate receiving said chain output signal; and
        a second logic gate receiving said chain output signal, wherein said first and second logic gates propagate their respective output signals in different directions, wherein each first logic gate forms part of a first logic gate chain and each second logic gate forms part of a second logic gate chain;
    a third logic gate receiving a first output signal from said first logic gate chain; and
    a fourth logic gate receiving a second output signal from said second logic gate chain, wherein said third and fourth logic gates propagate their respective output signals in different directions, and wherein each third logic gate forms part of a third logic gate chain and each fourth logic gate forms part of a fourth logic gate chain.

8. The hierarchical bidirectional bus of claim 7 further comprising means for selectively providing input signals to said first and second logic gate chains.

9. The hierarchical bidirectional bus of claim 7 further comprising means for selectively providing input signals to said third and fourth logic gate chains.

10. A method of driving an integrated circuit bus including first and second unidirectional, logic gate chains, each logic gate chain including a plurality of logic gates, wherein a first input terminal of each logic gate is selectively coupled to one of an output terminal of another logic gate in said logic gate chain and another signal source, and a second input terminal of each logic gate is coupled to an output terminal of a drive circuit, said method comprising:
    providing an output signal of said drive circuit onto said first and second unidirectional, logic gate chains; and
    driving said output signal in two directions on said first and second unidirectional, logic gate chains.

11. The method of claim 10 wherein said first and second unidirectional, logic gate chains are positioned substantially in parallel, the method further including:
    combining the signals on said first and second unidirectional, logic gate chains at an intermediate point along said chains.

12. The bidirectional bus of claim 1 wherein each of said first and second multiplexers programmably outputs a predetermined signal.

13. The bidirectional bus of claim 1 wherein at least one of the chains includes a plurality of multiplexers serially connected, wherein each multiplexer is enabled by an enable signal.

14. The bidirectional bus of claim 7 further including a combinational logic element for receiving the signals on said first and second logic gate chains.

15. The bidirectional bus of claim 7 further including a combinational logic element for receiving the signals on said third and fourth logic gate chains.

16. The method of claim 10 wherein said another signal source is provided using a programmable interconnect point.

17. The method of claim 10 wherein said integrated circuit bus further includes third and fourth unidirectional, logic gate chains, and interconnect elements for coupling said first and second unidirectional, logic gate chains to said third and fourth unidirectional, logic gate chains, wherein said method further includes:

driving said output signal in two directions on said third and fourth unidirectional, logic gate chains.

18. A bidirectional bus including a plurality of segments, each segment comprising:

a chain of bus drivers providing a first output signal;

a first logic gate receiving said first output signal;

a second logic gate receiving said first output signal, wherein said first and second logic gates propagate their respective output signals in different directions, wherein the first logic gates of said plurality of segments form a first logic gate chain and the second logic gates of said plurality of segments form a second logic gate chain; and means for combining the signals on said first and second logic gate chains.

19. The bidirectional bus of claim 18 wherein each segment further includes means for selectively providing an input signal to at least one of said first logic gate and said second logic gate.

20. The bidirectional bus of claim 18 wherein said first and second logic gate chains further include means for programmably segmenting said bidirectional bus.

* * * * *